United States Patent
Park et al.

(10) Patent No.: US 6,347,901 B1
(45) Date of Patent: Feb. 19, 2002

(54) SOLDER INTERCONNECT TECHNIQUES

(75) Inventors: Seungbae Park; Sanjeev Sathe, both of Johnson City; Aleksander Zubelewicz, Vestal, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/430,965

(22) Filed: Nov. 1, 1999

(51) Int. Cl.[7] .......................... H01L 21/60; B23K 35/14
(52) U.S. Cl. ...................... 403/270; 403/272; 228/56.3; 228/141.1; 228/163
(58) Field of Search ................. 403/270, 272; 228/141.1, 155, 167, 56.3

(56) References Cited

U.S. PATENT DOCUMENTS

| | | | |
|---|---|---|---|
| 1,665,360 A | * 4/1928 | Hawley | 403/272 |
| 3,839,727 A | * 10/1974 | Herdzik et al. | 228/123.1 X |
| 3,881,799 A | 5/1975 | Elliot et al. | |
| 4,032,243 A | * 6/1977 | Keifert et al. | 403/272 |
| 4,605,153 A | * 8/1986 | Van Den Brekel et al. | 228/56.3 |
| 4,705,205 A | * 11/1987 | Allen et al. | 228/56.3 X |
| 4,709,849 A | * 12/1987 | Socolowski | 228/56.3 X |
| 4,751,563 A | 6/1988 | Laibowitz et al. | |
| 5,118,299 A | 6/1992 | Burns et al. | |
| 5,172,473 A | 12/1992 | Burns et al. | |
| 5,242,569 A | 9/1993 | Kang et al. | |
| 5,381,946 A | * 1/1995 | Koopman et al. | 228/56.3 X |
| 5,842,274 A | * 12/1998 | Modl et al. | 228/56.3 X |

FOREIGN PATENT DOCUMENTS

| | | | | |
|---|---|---|---|---|
| EP | 120762 A1 | * 10/1984 | | 228/56.3 |
| GB | 2047150 A | * 11/1980 | | 228/56.3 |
| JP | 3-270235 A | * 12/1991 | | 228/56.3 |

* cited by examiner

*Primary Examiner*—Lynne H. Browne
*Assistant Examiner*—Ernesto Garcia
(74) *Attorney, Agent, or Firm*—Salzman & Levy; Lawrence R. Fraley

(57) ABSTRACT

A method and article of fabrication is described featuring a solder layer having a serpentine, interrupted, or interdigitated boundary. The non-planar design of the boundary layer increases the fatigue life of the solder joint by limiting the damage caused by micro-cracking. This irregularity of the solder boundary constrains the propagation of cracks by creating obstacles along the crack path, redirecting the crack away from the intermetallic layer, or by increasing the path along which the crack propagates.

2 Claims, 3 Drawing Sheets

SOLDER INTERCONNECT TECHNIQUES

FIELD OF THE INVENTION

The present invention relates to soldering techniques and, more particularly, to a solder method that enhances solder interconnects by eliminating solder joint failures caused by micro-cracking at or near the solder intermetallic interface.

BACKGROUND OF THE INVENTION

The fatigue life of solder interconnects is often poor, because cracks develop near an intermetallic layer. The damaging process is due to the build-up of inelastic deformation (creep) that leads to cavity nucleation, growth, and coalescence along grain boundaries. The increasing damage tends to produce micro-cracks at the boundaries. These boundary micro-cracks are disposed roughly normal to the direction of maximum tensile stress.

The factors that influence the aforementioned damage include: (a) the shape of the joint, which influences the stress concentration at the free joint boundaries; (b) the build-up of intermetallics, which are known to locally increase stress in solder at and above the intermetallic layer; and (c) the local coefficient of thermal expansion (CTE) mismatch between the pad and the solder.

It is also observed that dissolved copper, gold, or other metallic pad coating materials locally contaminate solder. The contaminants increase the solder brittleness, making the solder susceptible to micro-cracking, when compared with bulk behavior.

The present invention seeks to increase the fatigue life of the solder joint, by limiting the damage caused by micro-cracking in the solder joint. This objective is achieved by redistributing the stresses in solder, thus constraining the cracks. Such containment can be accomplished by creating obstacles along the crack path, redirecting the crack away from the intermetallic layer, or by increasing the path length along which the crack is to propagate. The solder layer can be designed to include a serpentine, interrupted, or interdigitated boundary. The method can be applied to ball grid arrays, column grid arrays, surface mount technology (SMT) joints, etc.

DISCUSSION OF THE RELATED ART

In U.S. Pat. No. 5,242,569, issued to Kang et al, on Sept. 7, 1993, for THERMOCOMPRESSION BONDING IN INTEGRATED CIRCUIT PACKAGING, a thermocompression bonding method is described that allows bonding to be achieved at lower temperatures. The process produces a soft, deformable layer of metal that is free of dendritic protrusions.

In U.S. Pat. No. 5,172,473, issued to Burns et al, on Dec. 22, 1992, for METHOD OF MAKING CONE ELECTRICAL CONTACT, a method of achieving improved electrical contact is illustrated. Contact is improved by generating cone-shaped projections upon a mating surface. The cones enhance ohmic contact by intermeshing and wiping.

In U.S. Pat. No. 5,118,299, issued to Burns et al, on Jun. 2, 1992, for CONE ELECTRICAL CONTACT, an electrical interconnection is shown featuring two detachable surfaces having intermeshing cone projections. The cones In U.S. Pat. No. 3,881,799, issued on May 6, 1975, to Elliott et al, for RESILIENT MULTI-MICRO POINT METALLIC JUNCTION, a dynamic interfacing contact device is disclosed. The device provides multiple points of contact between opposing parallel surfaces of a pair of conductors. The points of contact are provided by a number of spaced-apart, metal protrusions.

In U.S. Pat. No. 4,751,563, issued to the common assignee, a microminiaturized electrical interconnection device is described. Electrical connection on a first pad is tangentially raised at about sixty degrees and brought into intimate contact with a second metallic layer.

SUMMARY OF THE INVENTION

In accordance with the present invention, there is provided a method and article of fabrication, featuring a solder layer that comprises a serpentine, interrupted, or interdigitated boundary. The non-planar design of the boundary layer increases the fatigue life of the solder joint, by limiting the damage caused by micro-cracking. This irregularity of the solder boundary constrains the propagation of cracks by creating obstacles along the crack path, redirecting the crack away from the intermetallic layer, or by increasing the path length along which the crack propagates.

It is an object of this invention to provide a method and article of fabrication that improves the fatigue life of solder joints.

It is another object of the invention to produce a solder joint that constrains cracking along the intermetallic boundary.

BRIEF DESCRIPTION OF THE DRAWINGS

A complete understanding of the present invention may be obtained by reference to the accompanying drawings, when considered in conjunction with the subsequent detailed description, in which:

FIG. 4 illustrates a plan view of the micro-crack propagation at the solder boundary layer, using the pad configuration of FIG. 3a.

DESCRIPTION OF THE PREFERRED EMBODIMENT

Generally speaking, the invention features a method as well as solder pad configurations which increase the fatigue life of the solder joint. The method and pad configurations reduce the damage which is normally caused by micro-cracking at the solder and near intermetallic interface. This irregularity of the pad surface constrains the propagation of cracks by creating obstacles along the crack path, redirecting the crack away from the intermetallic layer, or by increasing the path along which the crack propagates.

Figure 1:
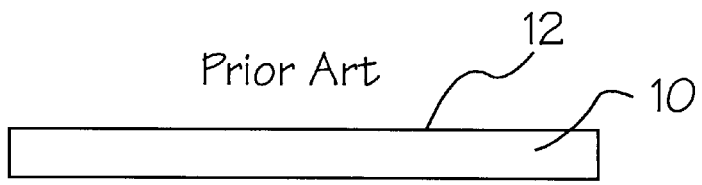
FIG. 1 illustrates a side view of the edge of the solder boundary of a prior art metallic pad.
Figure 2:
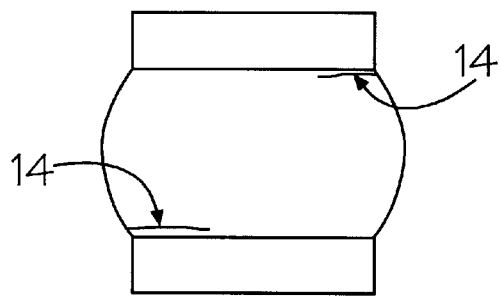
FIG. 2 depicts a plan view of the micro-crack propagation at the solder boundary layer, using the solder configuration of FIG. 1.

Now referring to FIG. 1, a plan view of a prior art metallic pad 10 is illustrated. The straight edge 12 of the solder boundary experiences adjacent micro-cracking 14 in solder near the intermetallic layer, as shown in FIG. 2. The micro-crack 14 tends to propogate, because there is no constraint against its growth.

Figure 3A:
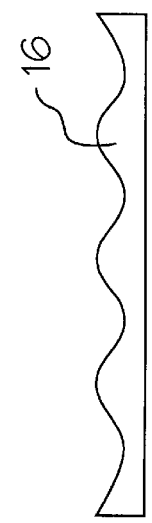
FIGS. 3a through 3g show a plan view of seven embodiments of the pad configuration of this invention.
Figure 3B:
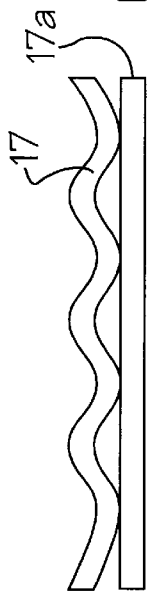
Figure 3C:
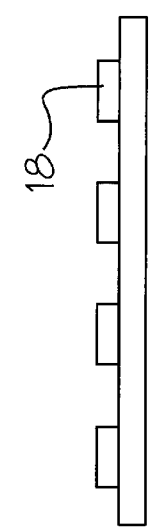
Figure 3D:
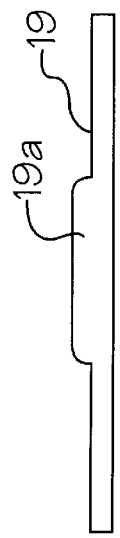
Figure 3E:
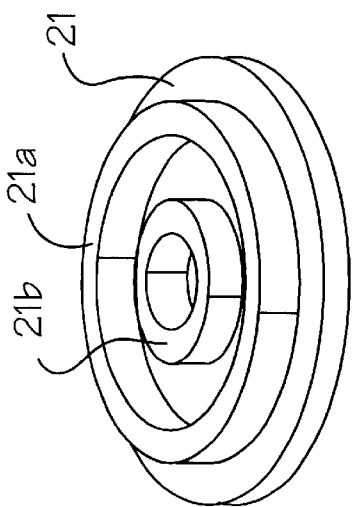
Figure 3F:
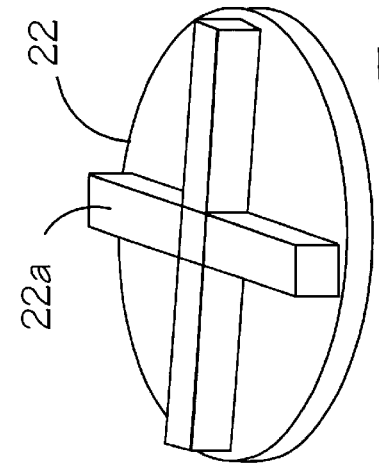
Figure 3G:
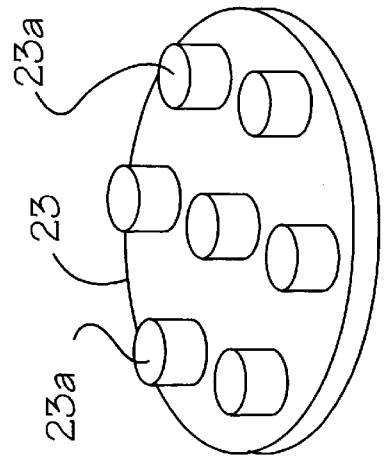

Referring to FIGS. 3a through 3g, a plan view of a plurality of irregularly shaped strips of solder 16, 17, 18, 19, 21, 22, and 23 respectively, is depicted. FIG. 3a depicts an undulating or serpentine strip of pad 16; FIG. 3b shows an undulating or serpentine strip of solder 17 having a straight base strip 17a; FIG. 3c illustrates an interdigitated strip of pad 18; FIG. 3d depicts a strip of pad 19 having a curved edged, central digit 19a; FIG. 3e depicts a pad having raised, concentric walls 21a and 21b, FIG. 3f shows a pad 22 having a raised cross-shaped feature 22a; and FIG. 3g illustrates a pad 23 having a plurality of foreshortened substantially cylindrical protrusions 23a disposed perpendicularly with respect to the major plane of the pad 23.

Figure 4:
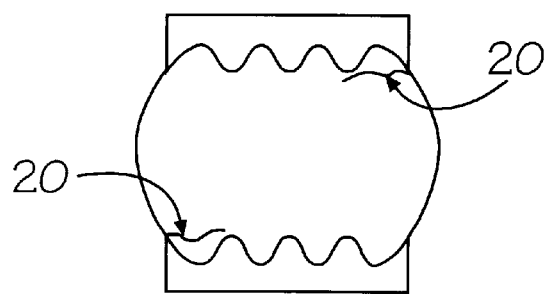
Figure 2A:
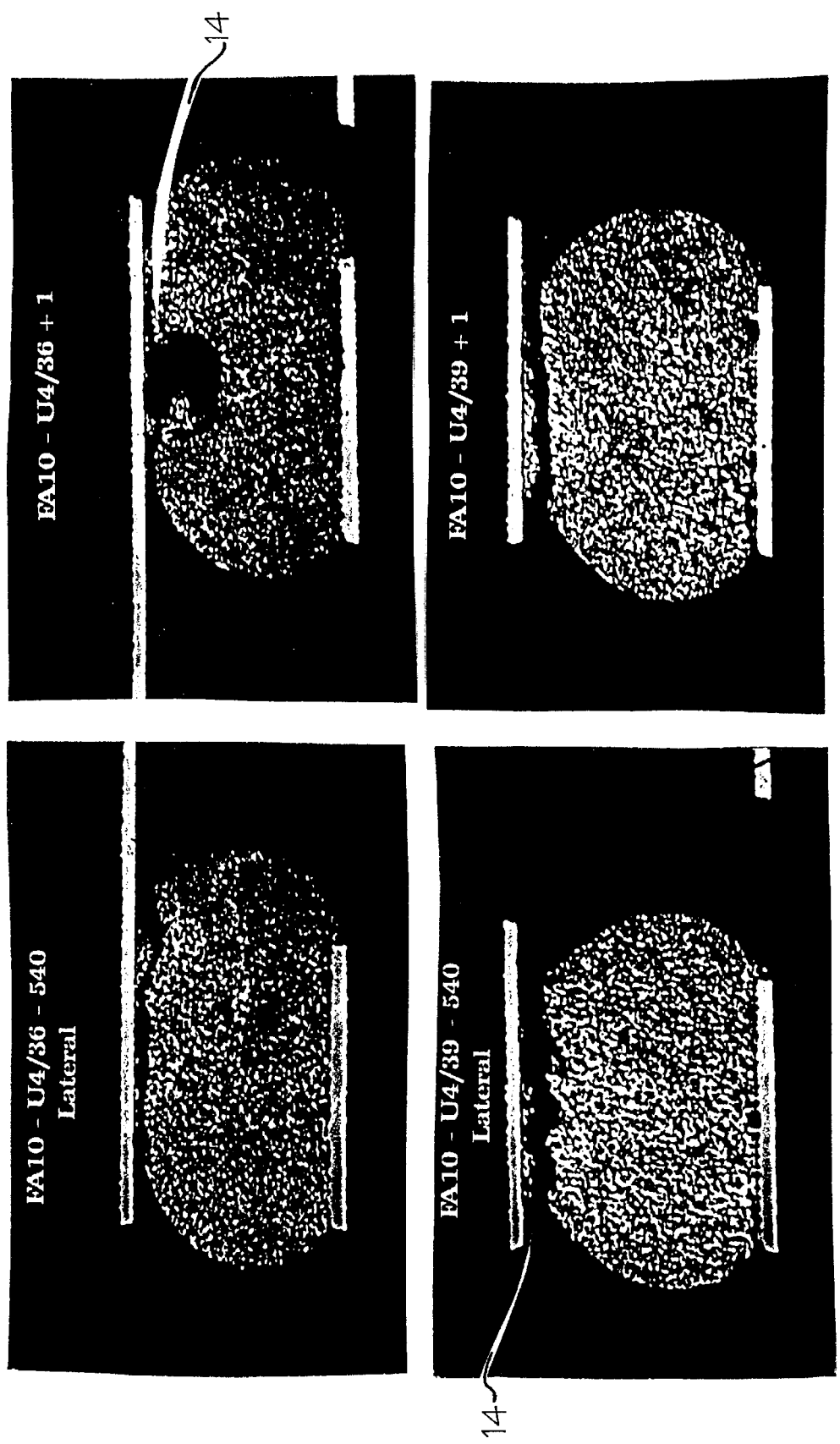
FIG. 2a is a greatly enlarged photograph of actual solder pads with defects represented in FIG. 2.

Referring to FIG. 4, a solder joint at the intermetallic boundary is shown, using the serpentine solder configuration depicted in FIG. 3a. It will be observed that the respective micro-cracking 20 at each intermetallic boundary is following a circuitous or meandering path. The lengthening of the crack pathway increases the useful life of the solder joint. Other pad configurations are shown in FIGS. 3b through 3d. As before, this results in micro-crack pathways which are interrupted, lengthened, or constrained. In similar manner, these configurations are expected to increase fatigue life of the solder joint, as is that of the solder design shown in FIG. 3a.

Since other modifications and changes varied to fit particular operating requirements and environments will be apparent to those skilled in the art, the invention is not considered limited to the examples chosen for the purpose of disclosure, and covers all changes and modifications which do not constitute departures from the true spirit and scope of this invention.

Having thus described the invention, what is desired to be protected by Letters Patent is presented in the subsequently appended claims.

What is claimed is:

1. A solder structure at an intermetallic boundary that disrupts, constrains, or shortens cracking at said intermetallic boundary, said intermetallic boundary being defined by a solder joint, and a boundary surface, said solder structure increasing fatigue life of the solder joint, said solder structure comprising a solder strip having a serpentine configuration aligned contiguously along said boundary surface.

2. A method of reducing fatigue failure in a soldered joint by soldering that disrupts, constrains, or shortens cracking at an intermetallic boundary, whereby fatigue life of a solder joint is increased, comprising the steps of:

a) placing solder at a pad contiguously along said intermetallic boundary; and b) providing a contiguous serpentine solder layer during bonding along said intermetallic boundary of said pad in order to increase fatigue life of said solder joint.

* * * * *